United States Patent [19]

Isobe et al.

[11] Patent Number: 5,150,173
[45] Date of Patent: Sep. 22, 1992

[54] METHOD AND APPARATUS FOR ALIGNMENT AND EXPOSURE

[75] Inventors: Kazuhito Isobe, Kawasaki; Reiji Hirano, Yokohama, both of Japan

[73] Assignee: Canon Kabushiki Kaisha, Tokyo, Japan

[21] Appl. No.: 646,401

[22] Filed: Jan. 28, 1991

[30] Foreign Application Priority Data

Jan. 31, 1990 [JP] Japan .................................. 2-019232

[51] Int. Cl.⁵ .............................................. G01B 11/00
[52] U.S. Cl. .................................... 356/401; 250/548; 355/53; 355/77
[58] Field of Search ....................... 356/399, 400, 401; 250/548; 355/43, 53, 77

[56] References Cited

U.S. PATENT DOCUMENTS

| | | | |
|---|---|---|---|
| 4,202,627 | 5/1980 | Suzki et al. | 356/71 |
| 4,355,892 | 10/1982 | Mayer et al. | 355/77 |
| 4,614,432 | 9/1986 | Kuniyoshi et al. | 250/548 |
| 4,798,962 | 1/1989 | Matsumoto et al. | 356/401 |

FOREIGN PATENT DOCUMENTS 53-135654 11/1978 Japan .

Primary Examiner—F. L. Evans
Attorney, Agent, or Firm—Fitzpatrick, Cella, Harper & Scinto

[57] ABSTRACT

An alignment and exposure method usable in manufacture of semiconductor devices, for aligning a mask and a wafer and for exposing the wafer to the mask to print a pattern of the mask on a photoresist of the wafer, is disclosed. The method includes illuminating an alignment mark of the wafer with first illumination light having a center wavelength at a first wavelength and second illumination light having a center wavelength at a second wavelength; adjusting the proportion of the first illumination light and the second illumination light; photoelectrically detecting the alignment mark of the wafer and adjusting the relative position of the wafer to the mask on the basis of a detection signal formed as a result of the photoelectric detection; and exposing the wafer to the mask with exposure light.

10 Claims, 4 Drawing Sheets

METHOD AND APPARATUS FOR ALIGNMENT AND EXPOSURE

FIELD OF THE INVENTION AND RELATED ART

This invention relates to an exposure method and apparatus for manufacture of semiconductor devices and, more particularly, to an alignment and exposure method and apparatus for aligning a mask (reticle) having a pattern prepared for manufacture of a semiconductor device with a semiconductor wafer on which the mask pattern is to be printed, on the basis of photoelectric detection of alignment marks and, after the alignment, for exposing the wafer to the mask with exposure light (printing light) to print the mask pattern on the wafer.

Conventionally, in such an alignment and exposure method and apparatus, for the mask-to-wafer alignment, non-printing light of a wavelength different from that of the printing light used for the mask pattern printing, is used to illuminate alignment marks, and images of these alignment marks are taken by a TV camera. From obtained video signals, a positional deviation between the mask and the wafer is calculated and, on the basis of this, the relative position of them is corrected.

On the other hand, U.S. Pat. No. 4,355,892 issued Aug. 26, 1982 proposes use of non-printing light of two different wavelengths to illuminate alignment marks of a wafer, in an attempt to reduce the effect of a photoresist applied to the wafer upon the photoelectric detection of the marks.

SUMMARY OF THE INVENTION

According to investigations made by the inventors of the subject application, it has been found that, when two wavelengths of non-printing light such as, for example, two wavelengths of light having peaks at 546 nm and 578 nm (which can be extracted out of a light source that produces printing light) are used to illuminate alignment marks, depending on dispersion of the film thickness of the photoresist on the wafer or depending on the difference in step structure of the wafer alignment mark, there is a large difference in the observability or detectability of the alignment marks through the photoelectric detecting means such as a TV camera.

It is considered that this is attributable mainly to the interference between the resist film thickness and the illumination light for observation. Between the illumination wavelength for observation and the resist film thickness, the following relationship can be established:

$$t = (\lambda/2n) \cdot (m + \tfrac{1}{2})$$

$$m = 0, 1, 2, \ldots$$

wherein t is the thickness of the resist film on the wafer, n is the refractive index of the resist, and λ is the wavelength of the illumination light for observation. When the above relationship is satisfied, the reflection light from a mark of the wafer is weakened.

Such a relationship is illustrated in the graph of FIG. 2. As seen from this graph, when two wavelengths of 546 nm and 578 nm are used for observation, if the resist film thickness corresponds to that at point A, B or C, for example, there is a possibility of failure in correct detection of the wafer mark.

It is accordingly a primary object of the present invention to provide an alignment and exposure method and apparatus by which a mark of a wafer can be detected surely and stably irrespective of the resist film thickness, etc.

In accordance with an aspect of the present invention, to achieve this object, in addition to a predetermined observation illumination light which can be extracted out of a printing light source, a different wavelength of illumination light such as, for example, He-Ne laser light having a wavelength of 633 nm, is used as an additional illumination light source. This makes it possible to avoid unstableness in the detection of alignment marks attributable to a difference in the resist film thickness or the step height of the wafer mark. Stepless ND filter means capable of continuously changing the quantity or strength of light passing therethrough as desired, may be disposed across the light paths for the He-Ne laser light and the non-printing light component extracted out of a Hg lamp used as the printing light source. This makes it possible to exchange plural illumination methods easily. Also, it is possible to automatically select a best illumination method with an optimum detection result, from a density histogram.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
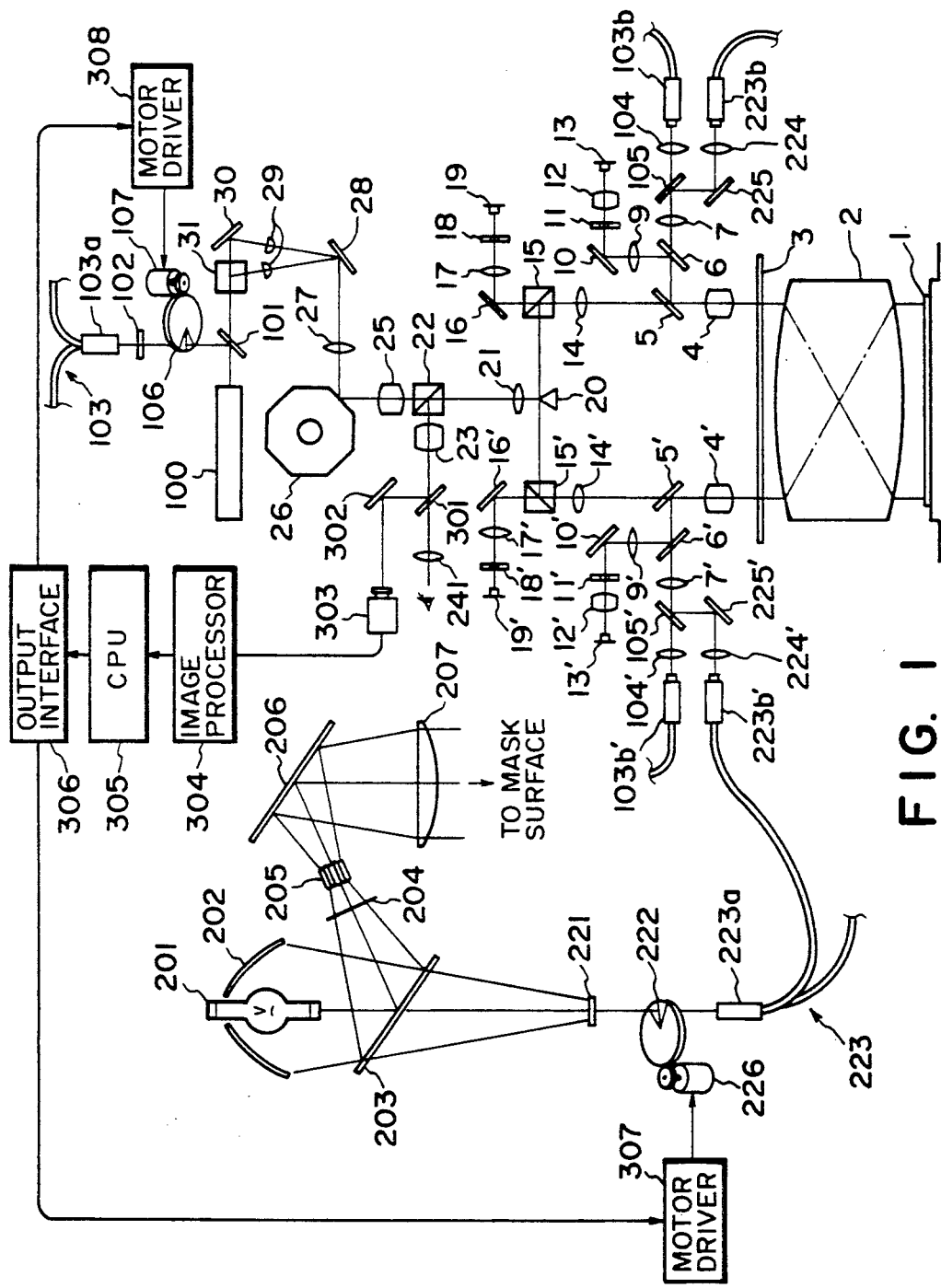
FIG. 1 is a schematic representation of an observation illumination system according to an embodiment of the present invention.
Figure 2:
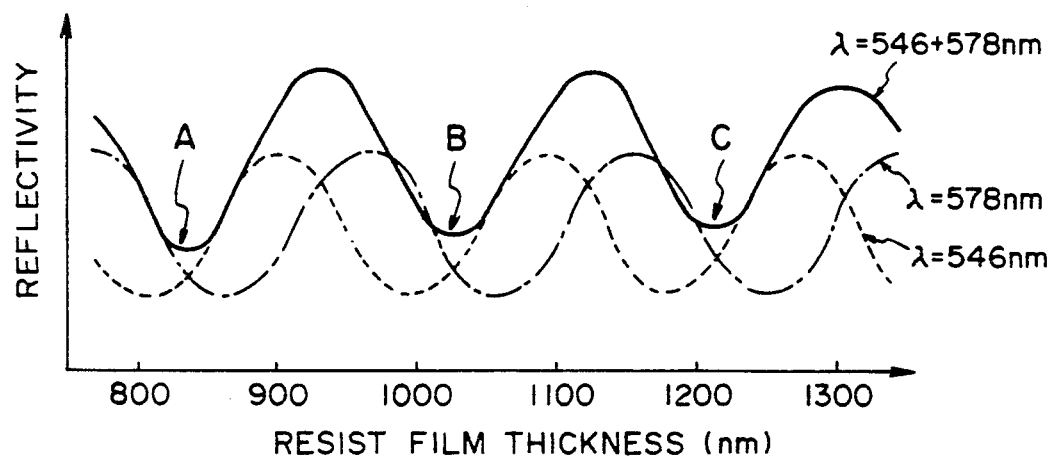
FIG. 2 is a graph showing the relationship between the resist film thickness and the reflectivity, according to a known method.

FIG. 1 is a schematic representation of an embodiment wherein the invention is applied to a projection type exposure apparatus.

In FIG. 1, while a mirror 101 is retracted out of the optical axis beforehand, a He-Ne laser 100 emits light which is directed to mirrors 30 and 31, to a cylindrical lens 29, to a mirror 28 and then to a lens 27. After this, the light is reflected by a rotating polygonal mirror 26 and it enters into an f-θ lens 25 by which the emanating light is made telecentric. The f-θ lens 25 has its entrance pupil plane coincident with the reflection surface of the polygonal mirror 26. The light passing through the f-θ lens 25 is directed to a half mirror 22 and then to a lens 21 and, after this, the light is distributed by a roof prism 20 into two, left-side and right-side alignment optical systems.

In this embodiment, the left-side and right-side alignment optical systems have symmetrical structures and, for this reason, only the right-side alignment optical system will be explained here.

The light distributed by the roof prism 20 is reflected by a half mirror 15 and, after passing through a lens 14 and a half mirror 5, it is projected by an objective lens 4 upon the surface of a reticle 3, which is on the image plane of the f-$\theta$ lens 25 or a plane conjugate therewith, as well as the surface of a wafer 1 which is on a plane conjugate with the reticle 3 surface with respect to a projection optical system 2. With the rotation of the polygonal mirror 25, the mask 3 surface as well as the wafer 1 surface are scanned simultaneously, in the telecentric state.

At two, left-side and right-side locations, the mask 3 and the wafer 1 have formed on their surfaces alignment patterns (not shown) as index marks for the mask-to-wafer alignment purpose. As the light goes in the neighborhood of an alignment pattern, at a portion where no edge of the alignment pattern is present, it is regularly reflected to produce what can be called "non-scattered light" which goes back along the same path as the path of incidence while, on the other hand, at a portion where an edge of the alignment pattern is present, it is diffractively or irregularly reflected to produce what can be called "scattered light" which goes back along paths different from the path of incidence.

The light of the non-scattered light component and the scattered light component passing through the objective lens 4 is divided into two by the half mirror 5. The light reflected by the half mirror 5 is reflected again by a half mirror 6 toward an MD system. On the other hand, the light passing through the half mirror 5 goes through the half mirror 15 toward an MW system.

The MD system comprises a lens 9, a mirror 10, a slit 11, a condenser lens 12 and a light receiving portion 13, and it receives non-scattered light and scattered light from a mask alignment pattern (first index mark) formed on the mask 3 surface.

The MW system comprises a mirror 16, a condenser lens 17, a slit 18 and a light receiving portion 19, and it receives non-scattered light and scattered light from a wafer alignment pattern (second index mark) formed on the wafer 1 surface, having passed through the mask 3. It is to be noted here that the MW system uses only the signal light from the wafer alignment pattern on the wafer surface. As regards the light inputted into the MW system (MD system), only the scattered light component is allowed to pass through the slit 11 (18) which is disposed at a position conjugate with the pupil plane of the objective lens 4 and which has a non-transparent central portion. The light from the slit 11 (18) is received by the light receiving portion 13 (19).

In this embodiment, the scattered light from the alignment pattern is detected in the manner described above and, on the basis of an obtained detection signal, any positional deviation between the mask 3 and the wafer 1 is detected in a central processing unit (CPU) 305, and then the relative position of them is adjusted.

In FIG. 1, denoted at 7 is a condenser lens, denoted at 23 is an erector lens, and denoted at 241 is an eye-piece lens. The laser beam scan type alignment method used in the FIG. 1 embodiment, is explained in detail in U.S. Pat. No. 4,202,627 (Japanese Laid-Open Patent Application No. 53-135654).

Next, the structure of the observation illumination system having a Hg lamp, will be explained by reference to FIG. 1.

In FIG. 1, denoted at 201 is a light source which comprises an ultra-high voltage Hg lamp or an excimer laser, for example, having an oscillation spectrum in a wide wavelength range. Denoted at 202 is an elliptical mirror for collecting effectively the radiation rays from the light source, particularly when a Hg lamp or the like is used as the light source 201. Denoted at 203 is a light dividing means which comprises a cold mirror, for example, and which has such an optical property that is effective to reflect the light in the exposure (printing) region corresponding to ultraviolet rays necessary for the exposure (photoprinting) but to allow passage of non-exposure (non-printing) light having spectral characteristics other than that. Denoted at 204 is a shutter which is adapted to block the exposure light from the cold mirror, during a period other than the exposure period. Denoted at 205 is a fly's-eye lens which is provided to adjust the distribution characteristic of the emanating light so as to provide a uniform illuminance distribution on the mask 3 surface (surface to be illuminated). Denoted at 206 is a mirror and denoted at 207 is a condenser lens, wherein the light from the mirror 206 is projected on the mask 3 surface. By this light projection, the wafer 1 can be exposed to the mask 3 pattern with the light passing through the mask, and a semiconductor circuit pattern formed on the mask can be printed on the wafer (photoresist on the wafer) under the influence of the projection lens 2. This exposure (printing) is started by the opening of the shutter 204, started after the execution of the mask-to-wafer alignment and in response to an instruction signal from the CPU 305.

On the other hand, the non-exposure light passing through the cold mirror 203 impinges on a heat-wave filter 221. This filter 221 is effective to block heat waves, of the non-exposure light, corresponding to infrared rays unnecessary for the illumination purpose. Denoted at 222 is a stepless ND filter having a disk-like shape, which is provided to adjust the quantity or strength of light passing therethrough. Denoted at 226 is a step motor for rotating the ND filter 222. By applying pulses of an appropriate number to the step motor 226 from a motor driver 307, it is possible to change, as desired, the quantity or strength of illumination light (non-exposure light) from the Hg lamp 201. The number of pulses to be supplied from the motor driver 307 is controlled by an instruction signal from the CPU 305, being transmitted through an output interface 306.

Denoted at 223 is a light guide which comprises, for example, a glass fiber having a forked light emission end (223b, 223b'), by which the light inputted from the ND filter 222 into a light entrance end 223a is supplied, from the forked light exit ends 223b and 223b', into two, left-side and right-side observation systems (which will be described later).

Denoted at 224 is a condenser lens for collecting the light from the exit end 223b of the light guide 223. The collected light goes via a mirror 225 and a half mirror 105, and it is collected by another condenser lens 7. Then, the light impinges on the half mirror 5 and enters the objective lens 4, such that it illuminates the mask 3 surface and, through the projection optical system 2, it illuminates the alignment mark on the wafer 1 surface.

The light from the alignment marks of the mask 3 and the wafer 1 goes by way of the objective lens 4, the mirror 5 and the condenser lens 14 and, after being reflected by the half mirror 15, it is inputted to the erector lens 23 by way of the roof prism 20, the lens 21 and the half mirror 22. The erector lens 23 collects the light from the roof prism 20 and directs it toward an image pickup surface of a TV camera 303 through a half mirror 301 and a mirror 302.

In this embodiment, the components disposed along the optical path from the condenser lens 224 to the mirror 15 constitute the right-side observation system, while the components disposed along the optical path from the condenser lens 224' to the mirror 15' constitute the left-side observation system. Images of the alignment marks formed on the image pickup surface by the combination of the right-side and left-side observation systems, is picked up by the TV camera 303. The image signal obtained thereby is processed by an image processor 305 in a well-known image processing method and, from the result of image processing, the CPU 305 detects the alignment error between the mask 3 and the wafer 1 and executes the mask-to-wafer alignment.

Next, the structure of the observation illumination system with a He-Ne laser will be explained by reference to FIG. 1.

In FIG. 1, He-Ne laser 100 produces laser light which is inputted to a stepless ND filter 106 of disk-like shape, by the mirror 101. At this time, the mirror 101 is set on the optical axis, beforehand. As a result, the projection of the He-Ne laser light to the optical arrangement of the above-described laser beam scan system, is blocked. Denoted at 107 is a step motor for rotating the ND filter 106. By applying pulses of an appropriate number to the step motor 107 from a motor driver 308, it is possible to change, as desired, the quantity or strength of illumination light based on the laser light from the He-Ne laser 100. The number of pulses to be outputted from the motor driver 308 is controlled in accordance with an instruction signal from the CPU 305, being transmitted through the output interface 306.

The laser light emanating from the stepless ND filter 106 is diffused by a diffusing plate 102. Denoted at 103 is a light guide which comprises, for example, a glass fiber having a forked light emission end (103b, 103b'). The light inputted into a light entrance end 103a is supplied, from the forked light exit ends 103b and 103b', to the two, right-side and left-side observation systems as described.

Similarly to the observation illumination system with the Hg lamp 201 described hereinbefore, the light from the alignment marks of the mask 3 and the wafer 1 is directed to the image pickup surface of the TV camera 303, and the mask-to-wafer alignment is carried out in a similar manner.

Figure 3:
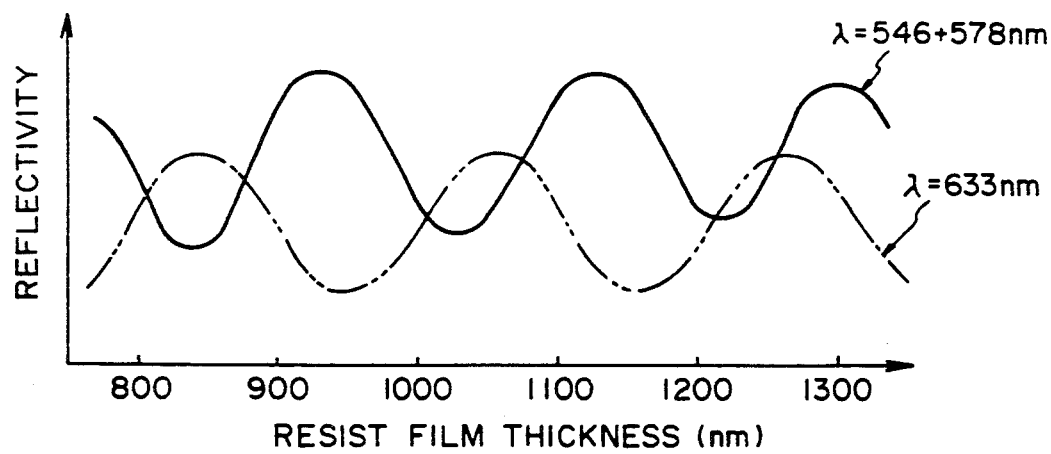
FIG. 3 is a graph showing the relationship between the resist film thickness and the reflectivity in an embodiment of the present invention.

FIG. 3 is a graph showing the relationship between the resist film thickness and the reflectivity on an occasion when the present invention is used. The graph shows an example in which, as the observation illumination light, He-Ne laser light (wavelength: 633 nm) as well as non-exposure light (wavelengths: 546 nm and 578 nm) from a Hg lamp, are used. As seen from this graph, it is possible to broaden the detectable range for the alignment mark considerably, by interchangingly or mixedly using the non-exposure light from the Hg lamp and the He-Ne laser light as the observation light source, in accordance with the resist film thickness of the wafer, for example.

Figure 4:
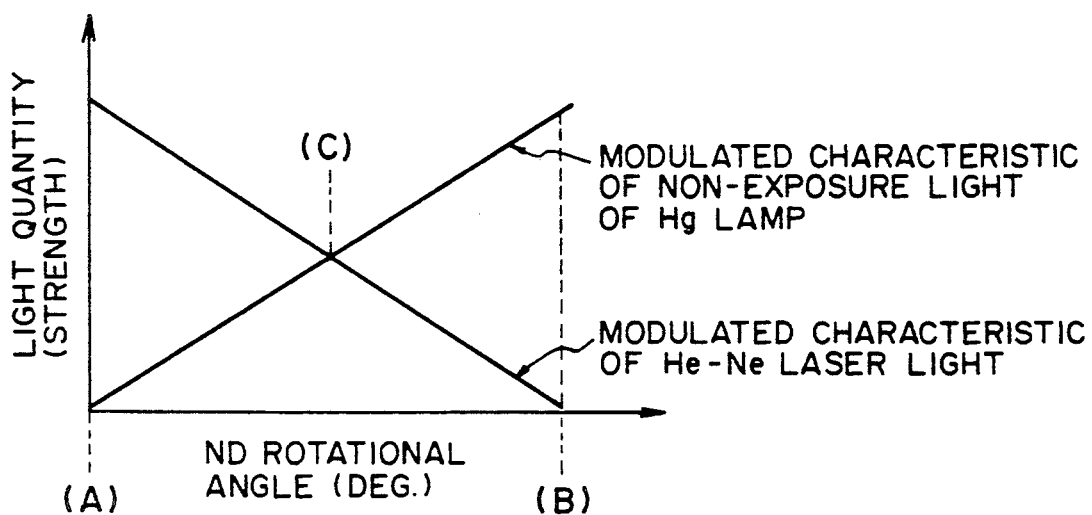
FIG. 4 is a graph showing light modulation characteristics in accordance with different illumination methods.

FIG. 4 shows an example of modulation characteristics of illumination with laser light from the He-Ne laser 100 and illumination with non-exposure light from the Hg lamp 201, under the influence of rotation of the stepless ND filters 106 and 222. The axis of abscissa depicts the rotational angle of each ND filter, and the axis of ordinate depicts the quantity or strength of light.

When the illumination is to be provided by the He-Ne laser illumination, the ND filter 106 may be rotated to the maximum position, defining point A in FIG. 4, whereat the highest quantity or strength of light can pass therethrough while, on the other hand, the ND filter 222 may be rotated to the minimum position whereat the lowest quantity or strength of non-exposure light can pass therethrough.

When the illumination is to be provided by the non-exposure light illumination from the Hg lamp 201, the ND filters 106 and 222 may be rotated in reverse directions, respectively, to point B in FIG. 4.

If the ND filters 106 and 222 are rotated so that the modulated characteristic of the non-exposure light from the Hg lamp 201 and the modulated characteristics of the laser light from the He-Ne laser 100, corresponding to point C in FIG. 4, are established, then the mask 3 and the wafer 1 can be observed through the TV camera 303 with the light in which the illumination by the He-Ne laser and the illumination by the non-exposure light from the Hg lamp are mixed in the ratio of 1:1.

Next, automatic selection of an illumination method will be explained.

Figure 5A:
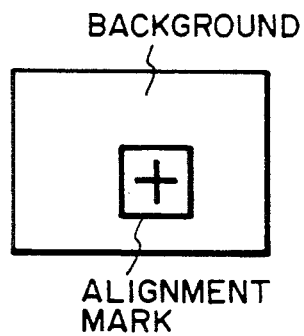
FIGS. 5A and 5B are representations for explaining an example of an alignment mark and its density histogram, on an occasion when the contrast is high.
Figure 5B:
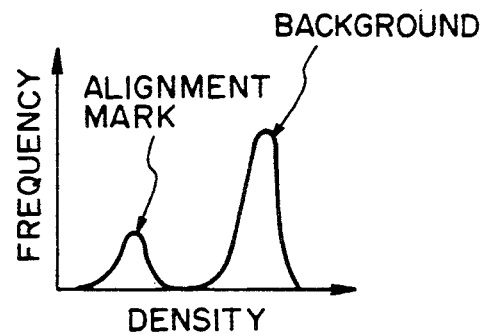

In the case of image processing by use of the TV camera 303, the quality of alignment mark detection is determined by the contrast ratio between the alignment mark and the background therearound. If, for example, the alignment mark is placed within the viewfield of the TV camera 303 such as shown in FIG. 5A and the contrast between the alignment mark and the background is good, the result of density histogram extraction will be such as shown in FIG. 5B. In FIG. 5B, the axis of abscissa depicts the density (gradation), and the axis of ordinate depicts the frequency. As seen from this Figure, when the contrast ratio between the alignment mark and the background is good, the density histogram has two definite peaks.

Figure 6A:
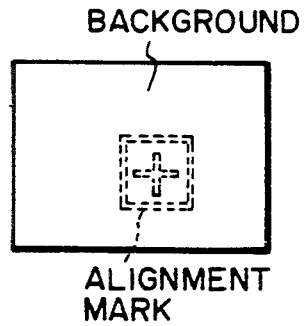
FIGS. 6A and 6B are representations for explaining an alignment mark and its density histogram, on an occasion when the contrast is low.
Figure 6B:
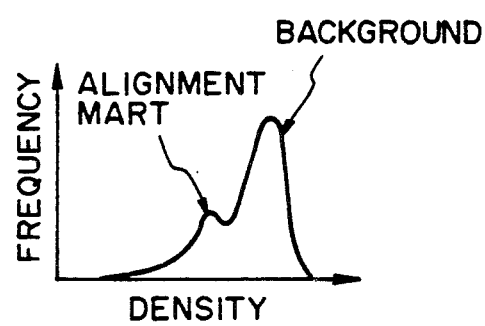

If the contrast between the alignment mark and the background is not good such as shown in FIG. 6A, the density histogram extraction results in such as shown in FIG. 6B wherein the density histogram of the alignment mark area partially overlaps upon that of the background area. Thus, it is difficult to discriminate the alignment mark from the background. In a worst case, e.g., if no alignment mark can be seen, the density histogram shows only a single peak corresponding to the background area.

In this manner, in a particular state of illumination, by the density histogram extraction and from the state of extracted distribution, it is possible to discriminate the quality of the detection. Thus, in the case of the modulation characteristics as shown in FIG. 4, the ND filters 106 and 222 may be rotated intermittently from point A to point B, while the density histogram may be detected sequentially by using the CPU 305. From the obtained results, it is possible to discriminate the state of alignment mark detection and, therefore, it is possible to determine the optimum illumination method best suited for a particular wafer process, that is, to determine the optimum mixture ratio of the He-Ne laser illumination light and the non-exposure light from the Hg lamp.

As a matter of course, if such an optimum mixture ratio determination is made with regard to every wafer, the throughput of the exposure apparatus reduces. Therefore, from the point of efficiency, preferably the above-descried process may be executed only to a first wafer in a particular wafer process and, with regard to a second wafer and wafers following it, the data on the state of illumination for the first wafer may be used.

Figure 7:
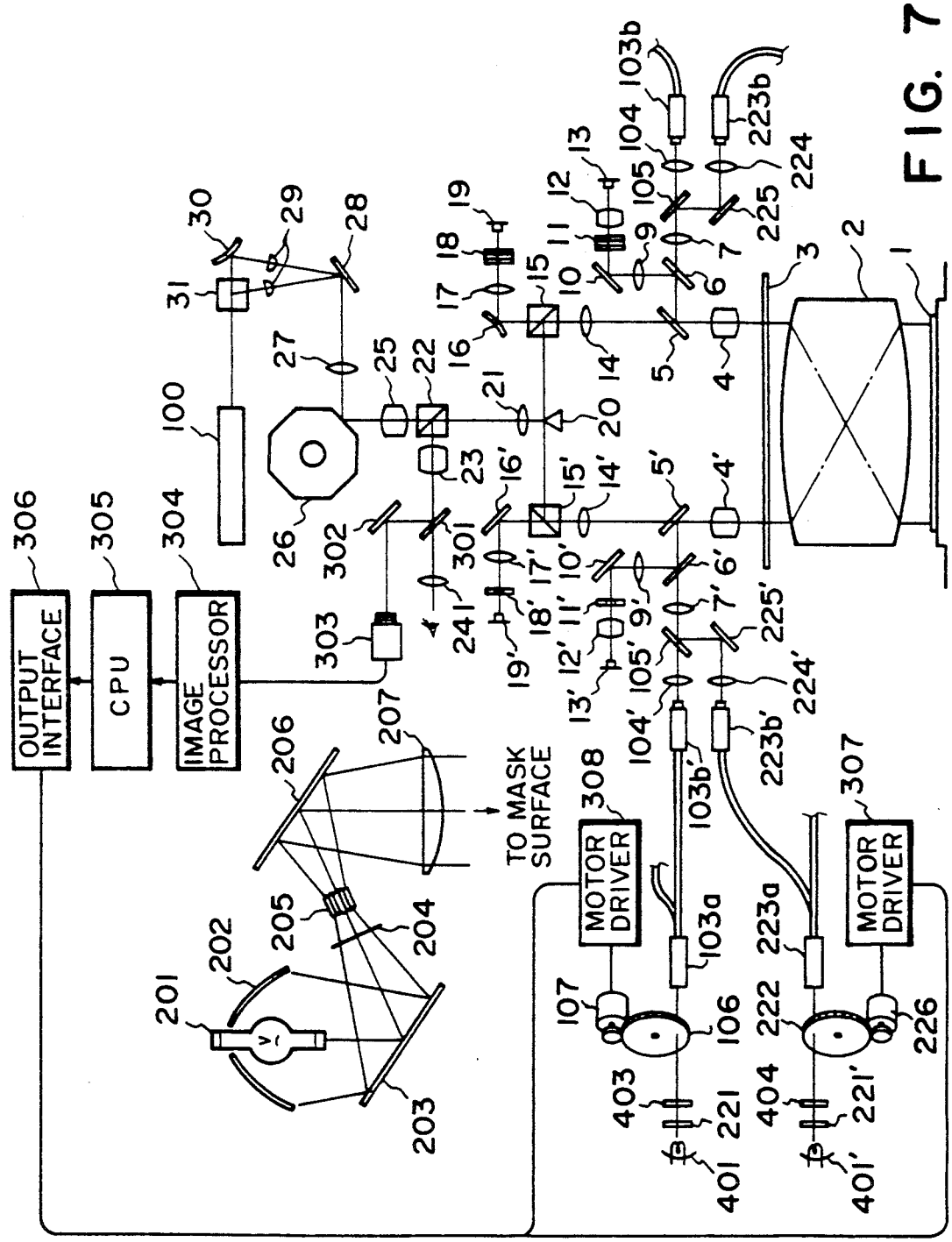
FIG. 7 is a schematic representation of another embodiment of the present invention.

FIG. 7 shows another embodiment wherein, as compared with the FIG. 1 embodiment, white light sources 401 and 401' each comprising a xenon lamp or halogen lamp, for example, are used in place of the He-Ne laser light source 100 and the Hg lamp 201 (non-exposure light source). Additionally, color filters 403 and 404 which are different in the wavelength of light allowed to pass therethrough, are disposed across respective optical paths. With this structure and by using the light modulating means described with reference to the preceding embodiment, an optimum illumination method can be determined and provided.

As for the lights to be allowed to pass through the color filters 403 and 404, respectively, an enhanced effect is obtainable by selecting an appropriate center wavelength, from the state of interference of reflection light attributable to the wafer process and the resist film thickness.

As described hereinbefore, by using plural light sources as observation illumination light source means and by interchangingly or mixedly using illumination lights from these light sources as having different wavelengths, it is possible to avoid unstableness in the alignment mark detection, attributable to any variation in the resist film thickness on the wafer or any variation in the step height of the alignment mark structure. Also, with the provision of filter means capable of changing the quantity or strength of illumination light as desired, in the path of light from each light source, it is possible to ensure independent illumination with a desired one of the light sources used or, alternatively, to ensure mixed illumination with them. The illumination methods can be interchanged easily.

Further, it is possible to determine an optimum illumination method to a particular wafer process automatically, by changing the mixture ratio of different illumination lights stepwise and by discriminating the goodness of alignment mark detection from the density histogram.

While the invention has been described with reference to the structures disclosed herein, it is not confined to the details set forth and this application is intended to cover such modifications or changes as may come within the purposes of the improvements or the scope of the following claims.

What is claimed is:

1. An alignment and exposure method usable in manufacturing semiconductor devices, for aligning a mask and a wafer and for exposing the wafer to the mask to print a pattern of the mask on a photoresist of the wafer, said method comprising the steps of:
   illuminating the wafer with first illumination light having a center wavelength at a first wavelength and second illumination light having a center wavelength at a second wavelength;
   adjusting the proportion of the first illumination light and the second illumination light;
   illuminating an alignment mark of the wafer with the proportion-adjusted first and second illumination light;
   photoelectrically detecting the illuminated alignment mark of the wafer and adjusting the relative position of the wafer with respect to the mask on the basis of a detection signal formed as a result of the photoelectric detection; and
   exposing the wafer to the mask with exposure light.

2. A method according to claim 1, wherein the first and second wavelengths are different from the wavelength of the exposure light.

3. A method according to claim 1, wherein the first illumination light is provided by a first light source and the second illumination light is provided by a second light source.

4. A method according to claim 3, wherein the first light source comprises a Hg lamp and the second light source comprises a laser light source.

5. A method according to claim 4, wherein the first illumination light is extracted out of light produced by the Hg lamp, by using a filter.

6. A method according to claim 1, wherein the adjustment of the proportion of the first illumination light and the second illumination light is made by using filters disposed across the paths for the first illumination light and the second illumination light, respectively.

7. A method according to claim 1, wherein image pickup means is provided to execute the photoelectric detection of the alignment mark, and wherein the proportion of the first illumination light and the second illumination light is adjusted so as to provide enhanced contrast of an image of the alignment mark to be picked-up by the image pickup means.

8. An alignment and exposure apparatus for aligning a mask and a substrate and for exposing the substrate to the mask to print a pattern of the mask on a photoresist of the workpiece, said apparatus comprising:
   a first light source for providing first illumination light having a center wavelength at a first wavelength, for illumination of an alignment mark of the substrate;
   a second light source for providing second illumination light having a center wavelength at a second wavelength, for illumination of the alignment mark of the substrate;
   light adjusting means having filters disposed across the paths for the first illumination light and the second illumination light, respectively, said light adjusting means being operable to control movement of said filters to adjust the proportion of the first illumination light and the second illumination light to be projected upon the alignment mark of the substrate;
   image pickup means for picking up the alignment mark;
   processing means for processing an image signal from said image pickup means, to adjust the relative position of the substrate to the mask; and
   exposure means for exposing the substrate to the mask with exposure light, after adjustment of the relative position of the substrate to the mask.

9. An apparatus according to claim 8, wherein each of said filters comprise a rotatable ND filter for continuously changing one of the quantity and strength of light passing therethrough.

10. An apparatus according to claim 8, wherein said processing means calculates a density histogram of the alignment mark image as picked up by said image pickup means, discriminates an optimum proportion of the first illumination light and the second illumination light by using the density histogram, and controls said light adjusting means on the basis of the discrimination.

* * * * *

UNITED STATES PATENT AND TRADEMARK OFFICE
CERTIFICATE OF CORRECTION

PATENT NO. : 5,150,173
DATED : September 22, 1992
INVENTOR(S) : Kazuhito Isobe, et. al.

It is certified that error appears in the above-indentified patent and that said Letters Patent is hereby corrected as shown below:

IN THE DRAWINGS

FIG. 6B, "MART" should read --MARK--.

COLUMN 5

Line 16, "is" should read --are--.

COLUMN 7

Line 3, "above-descried" should read --above-described--.

Signed and Sealed this

Nineteenth Day of October, 1993

Attest:

BRUCE LEHMAN

Attesting Officer

Commissioner of Patents and Trademarks